(12) United States Patent
Keil et al.

(10) Patent No.: US 7,455,748 B2
(45) Date of Patent: Nov. 25, 2008

(54) MAGNETIC ENHANCEMENT FOR MECHANICAL CONFINEMENT OF PLASMA

(75) Inventors: Douglas L. Keil, Fremont, CA (US);
Lumin Li, Santa Clara, CA (US); Eric A. Hudson, Berkeley, CA (US); Reza Sadjadi, Saratoga, CA (US); Eric H. Lenz, Pleasanton, CA (US); Rajinder Dhindsa, San Jose, CA (US); Ji Soo Kim, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 532 days.

(21) Appl. No.: 10/600,191

(22) Filed: Jun. 20, 2003

(65) Prior Publication Data

US 2005/0006028 A1    Jan. 13, 2005

(51) Int. Cl.
*C23F 1/00*      (2006.01)
*H01L 21/306*    (2006.01)
*C23C 16/00*     (2006.01)

(52) U.S. Cl. .............................. 156/345.46; 118/723 E

(58) Field of Classification Search ................ 427/715, 427/723 R, 723 MA
See application file for complete search history.

(56) References Cited

U.S. PATENT DOCUMENTS

| 6,019,060 | A | * | 2/2000 | Lenz ...................... 118/723 R |
| 6,051,151 | A | * | 4/2000 | Keller et al. .................. 216/68 |
| 6,074,518 | A |   | 6/2000 | Imafuku et al. ............. 156/345 |
| 6,085,688 | A |   | 7/2000 | Lymberopoulos et al. . 118/723 I |
| 6,872,281 | B1 | * | 3/2005 | Chen et al. ............. 156/345.43 |
| 2003/0010454 | A1 |   | 1/2003 | Bailey, III et al. |

OTHER PUBLICATIONS

International Search Report, dated Feb. 8, 2005.
Austrian Examination Report dated Nov. 15, 2007 for related Singapore Patent Application No. 200507909-0.

* cited by examiner

*Primary Examiner*—Parviz Hassanzadeh
*Assistant Examiner*—Maureen G Arancibia
(74) *Attorney, Agent, or Firm*—Beyer Law Group LLP

(57) ABSTRACT

A plasma processing apparatus for processing a substrate is provided. A plasma processing chamber with chamber walls is provided. A substrate support is provided within the chamber walls. At least one confinement ring is provided, where the confinement ring and the substrate support define a plasma volume. A magnetic source for generating a magnetic field for magnetically enhancing physical confinement provided by the at least one confinement ring is provided.

17 Claims, 7 Drawing Sheets

MAGNETIC ENHANCEMENT FOR MECHANICAL CONFINEMENT OF PLASMA

BACKGROUND OF THE INVENTION

The present invention relates to plasma processing chambers with confinement rings U.S. Pat. No. 6,019,060, entitled "Cam-Based Arrangement For Positioning Confinement Rings In A Plasma Processing Chamber," by Eric H. Lenz, issued Feb. 1, 2000 discloses a plasma processing etch chamber that uses confinement rings to confine plasma within volume. The confinement rings are place within the plasma chamber walls and may help to reduce the amount of plasma and other gases reaching the chamber wall, maintain pressure within the confinement rings, and control the flow of gas past the confinement rings.

During various plasma processes, it may be desirable to increase the flow of gas past the confinement ring, while minimizing the amount of plasma and other gases reaching the chamber walls.

SUMMARY OF THE INVENTION

To achieve the foregoing and in accordance with the purpose of the present invention a method for processing a substrate is provided. The substrate is placed in a process chamber. A gas is provided from a gas source to the process chamber. A plasma is generated from the gas in the process chamber. The gas flows through a gap adjacent to at least one confinement ring to provide physical confinement of the plasma. Magnetic confinement of the plasma is provided to enhance the physical confinement of the plasma.

In another embodiment of the invention, a plasma processing apparatus for processing a substrate is provided. A plasma processing chamber with chamber walls is provided. A substrate support is provided within the chamber walls. At least one confinement ring is provided, where the confinement ring and the substrate support define a plasma volume. A magnetic source for generating a magnetic field for magnetically enhancing physical confinement provided by the at least one confinement ring is provided.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
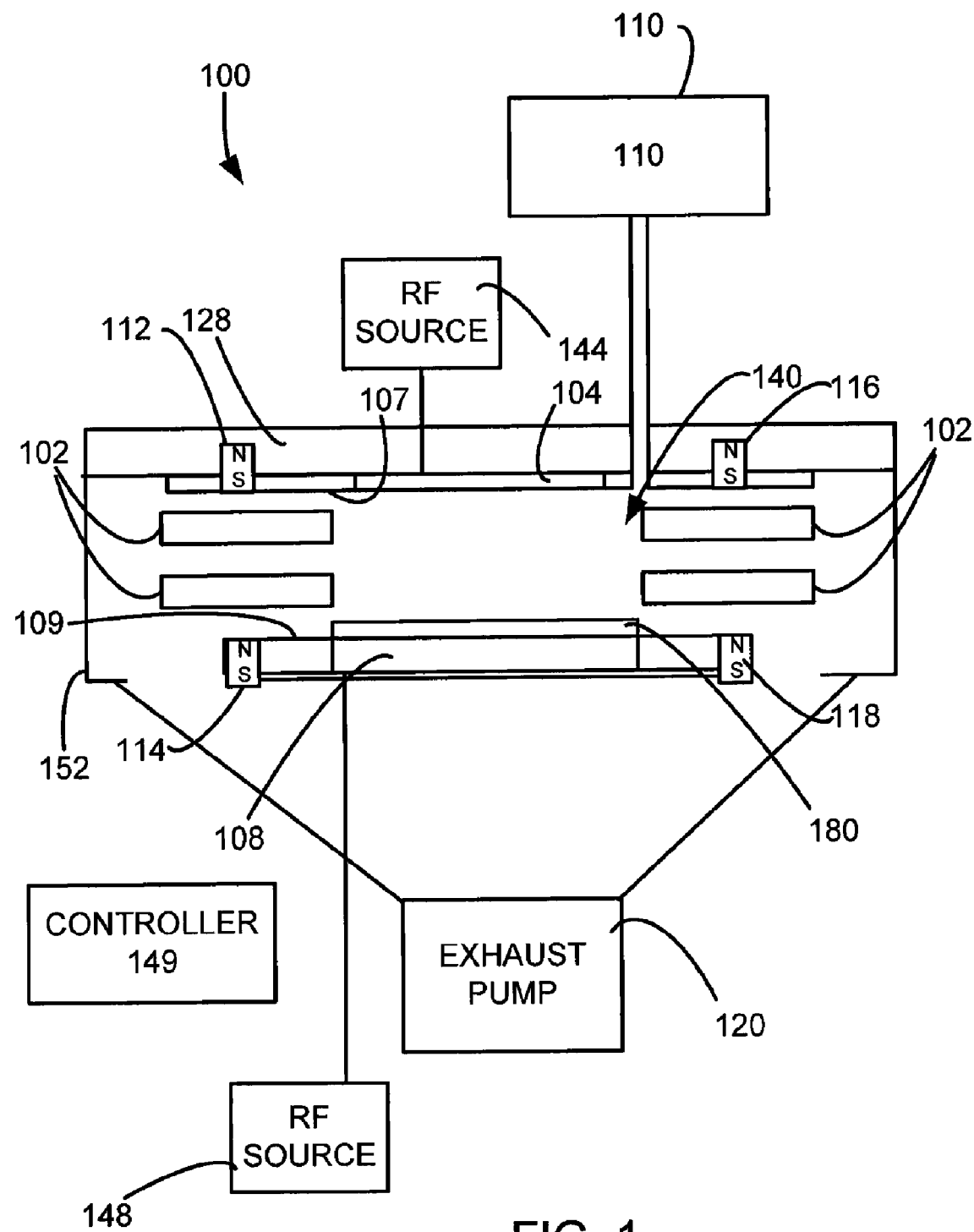
FIG. 1 is a schematic view of a plasma processing chamber that may be used in an embodiment of the invention.

To facilitate understanding, FIG. 1 is a schematic view of a plasma processing chamber 100 that may be used in an embodiment of the invention. The plasma processing chamber 100 comprises confinement rings 102, an upper electrode 104, a lower electrode 108, a gas source 110, and an exhaust pump 120. Within plasma processing chamber 100, the wafer 180 is positioned upon the lower electrode 108, which forms a wafer support. The lower electrode 108 incorporates a suitable substrate chucking mechanism (e.g., electrostatic, mechanical clamping, or the like) for holding the wafer 180. The reactor top 128 incorporates the upper electrode 104 disposed immediately opposite the lower electrode 108. A chamber volume is defined by the chamber wall 152, the chamber ceiling 107 and floor 109. Within the chamber volume, the upper electrode 104, lower electrode 108, and confinement rings 102 define the confined plasma volume 140.

Figure 2:
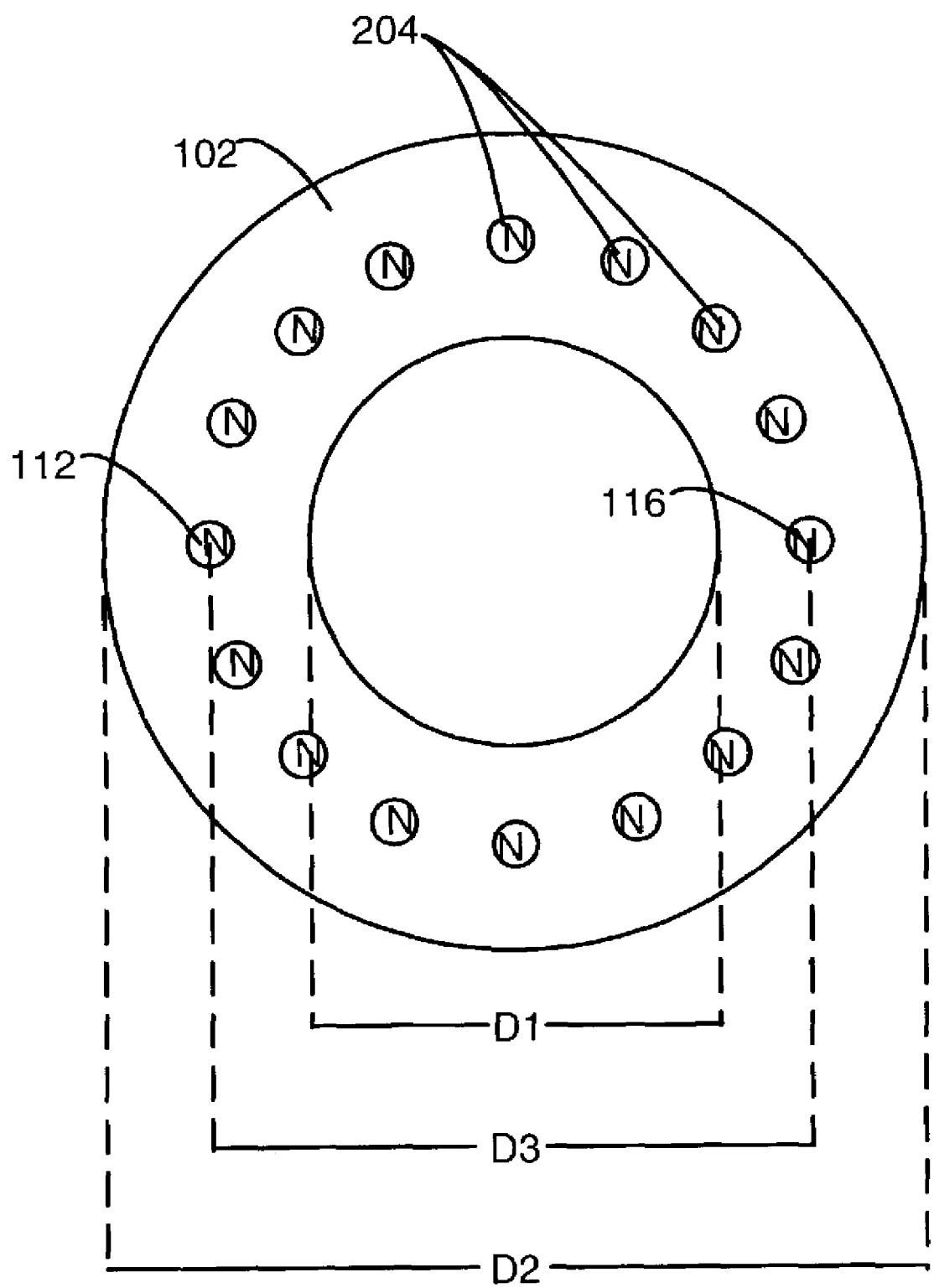
FIG. 2 is a top schematic view of confinement rings and top magnets in the embodiment shown in FIG. 1.

A plurality of magnets 112, 114, 116, 118 are placed around the confinement rings 102 to form a magnetic field in the region of the confinement rings 102. The magnets 112, 114, 116, 118 are placed to provided a magnetic field in the region of the confinement rings. In this embodiment, this is accomplished by providing the magnets in pairs. A first pair of magnets 112, 114 are placed spaced part from each other on opposite sites of the confinement rings 102, as shown. A second pair of magnets 116, 118 is placed spaced apart from each other on opposite sides of the confinement rings 102, as shown. FIG. 2 is a top schematic view of the confinement rings 102 and top magnets 112, 116, 204. The top magnet of the first pair of magnets 112 is shown as being above part of the circumference of the confinement ring 102. The top magnet of the second pair of magnets 116 is shown as being above part of the circumference of the confinement ring 102 on the opposite side of a diameter of the confinement ring 102 extending from the top magnet of the second pair of magnets 112. Additional top magnets 204 form a circle above the circumference of the confinement ring 102 as shown. In this embodiment, all of the top poles of the top magnet are the north poles, so that the magnets are not alternated between adjacent magnets. The confinement rings 102 have an inner diameter D1 and an outer diameter D2. The ring formed by the top magnets 112, 116, 204 has a diameter D3. In this embodiment, the ring D3 formed by the top magnets 112, 116, 204 is less than the outer diameter D2 of the confinement rings 102 and greater than the inner diameter D1 of the confinement rings.

Gas is supplied to the confined plasma volume by gas source 110 and is exhausted from the confined plasma volume through the confinement rings 102 to an exhaust port through the exhaust pump 120. A first RF so electrically connected to the upper electrode 104. A second RF source 148 is electrically connected to the lower electrode 108. Both the first RF source 144 and the second RF source 148 may comprise a 27 MHz power source and a 2 MHz power source. Different combinations of connecting RF power to the electrode are possible. In the case of Exelan HP made by LAM Research Corporation™ of Fremont, Calif. modified with additional magnets, which may be used in a preferred embodiment of the invention, both the RF sources are connected to the lower electrode, and the upper electrode is grounded. A controller 149 may be controllably connected to the gas source 110, the first and second RF power sources 144, 148, the confinement rings 102, and the exhaust pump 120.

In operation, an etch is used where a high gas flow rate is desired. The confinement rings 102 are adjusted to provide a large gap between the confinement rings, to reduce the flow resistance caused by the confinement rings 102, which increases the flow rate of gas through the confinement rings 102 to the exhaust pump 120. With an increase in the flow of gas through the confinement rings, an increase of ions and contaminants may also flow through the confinement rings to contaminate the chamber walls 152.

The purpose of the magnets is to work with the confinement rings to increase the confinement of charged particles (ions and/or electrons), while allowing a high flow rate of neutral gas. In this example, the increased confinement is achieved by having the magnetic field increase the percentage of charged particles that collide with the confinement rings.

Figure 3:
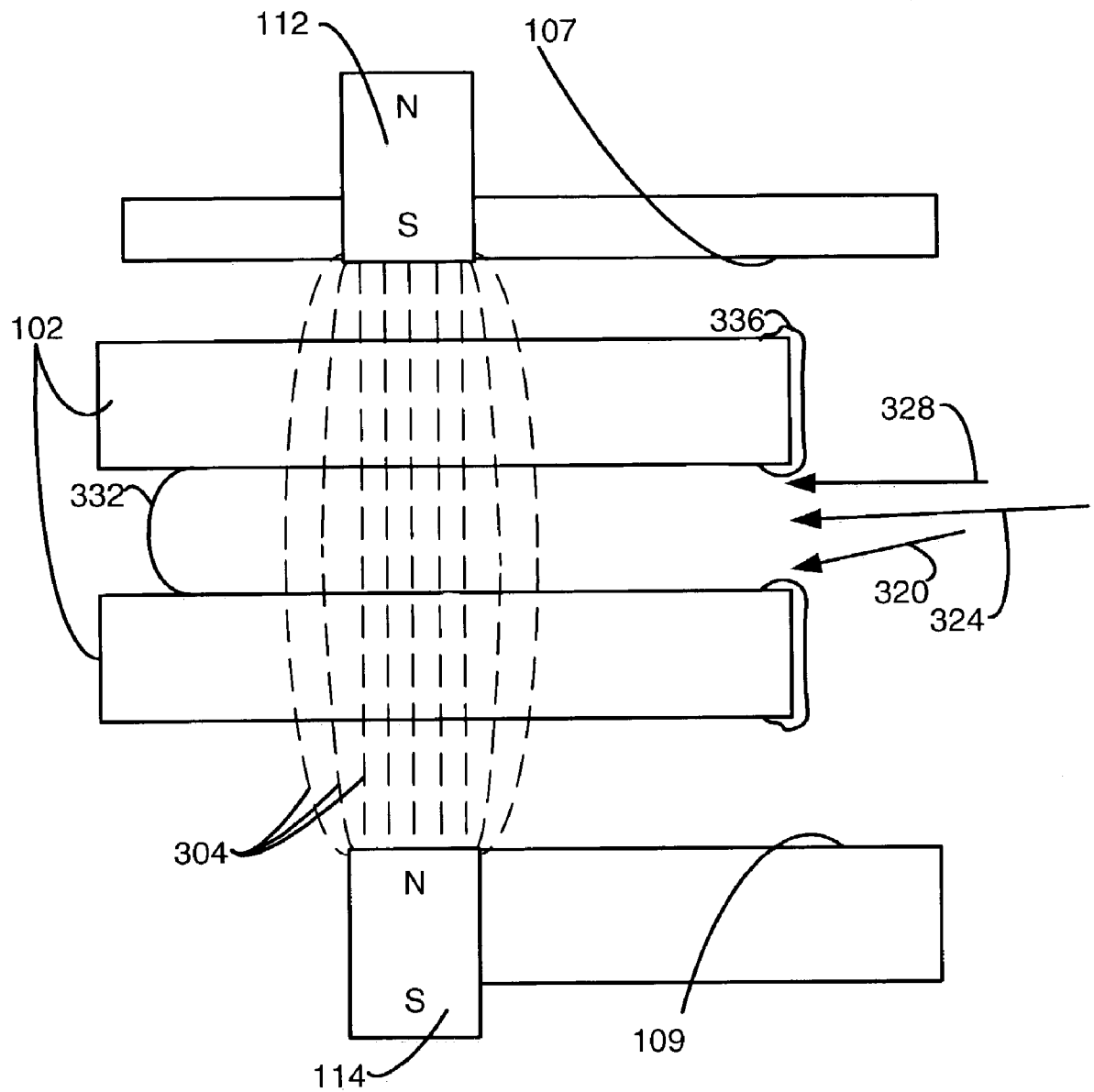
FIG. 3 is an enlarged view of part of the confinement rings with a first pair of magnets.

FIG. 3 is an enlarged view of part of the confinement rings 102 with the first pair of magnets 112, 114 to show general workings of this embodiment of the invention. A more rigorous description of the theory behind the invention will be provided later. Magnetic field lines 304 between the magnets 112, 114 are shown. The magnetic field lines 304 pass through the confinement rings 102.

Various examples of charged particle trajectories are shown. A first charged particle trajectory 320 is directed to collide into the lower confinement ring 102. In such a case, the magnetic fields 304 are not needed to help in the confinement of such particles. The prevention of plasma from passing through the confinement rings is provided by the confinement rings (physical confinement) alone. A second particle trajectory 324 is not directed to collide with the confinement rings 102 within the normal path length of the particle passing between the confinement rings and is not parallel to the confinement rings 102, so that the particle approaches one of the confinement rings. As such, particles pass through the magnetic field 304 the trajectory of the particle path is bent. In this embodiment, the trajectory is bent to increase the particle path length between the confinement rings 102. The increased path length causes the approach of the particle to the confinement ring to be sufficient to cause the particle to collide with the confinement ring. Therefore, the prevention of these charged particles from passing between the confinement rings is enhanced by the magnetic field. A third charged particle trajectory 328 is almost parallel to the confinement rings 102. As such, particles pass through the magnetic field 304 the trajectory of the particle path is bent. The trajectory is bent to increase the particle path length between the confinement rings 102. These particles are sufficiently parallel to the confinement rings 102 so that even with an increased path length, these particles do not collide with the confinement rings. Therefore, the physical confinement of the confinement rings and the magnetic enhancement does not cause these particles to collide with the confinement rings. These particles may collide with other particles, causing a change in their trajectory, which could cause them to collide with the confinement rings 102.

Under various regimes, physical confinement is sufficient, since the confinement rings are kept close enough so that a sufficient number of charged particles collide with the confinement rings. However, it has been found that in some processes a high flow of neutral gases is desired. In such a case, the confinement rings are separated to form a larger gap to allow a higher flow of neutral gas to pass within the gap to the exhaust pump 120. The larger gap also causes a lower fraction of the charged particles from colliding with the confinement rings. The presence of the magnetic field increases the fraction of the charged particles that collide with the confinement rings. A plasma extinction line 332 is the border where the plasma is extinguished. As shown, the plasma is extinguished between the confinement rings 102, and therefore does not extend beyond the confinement rings 102, and does not reach the walls of the plasma chamber, which prevents the plasma from damaging or contaminating the walls of the plasma chamber. It has been found that the confinement of the plasma results in the confinement of polymer deposition. As the fraction of the charged particles that collide with the confinement rings 102 increases, it is believed that for processes using polymer gases, the fraction of polymer that forms on the confinement ring 336 increases, decreasing the fraction of polymer that forms on the walls of the plasma chamber. This is desirable to lower the amount of contamination from the chamber walls.

It should also be noted that the magnetic fields may increase the percentage of ions or electrons that collide with the inner ceiling 107 and the floor 109 of the plasma chamber. The inner ceiling 107 and floor 109 together with the confinement rings 102 form the physical confinement system by providing in these embodiments three gaps through which gas may be exhausted with a first gap between the inner ceiling 107 and the top surface of a confinement ring, a second between the confinement rings 102, and a third gap between the floor 109 and a bottom surface of a confinement ring. The widest gap is between the confinement rings 102.

An example of a device in which the invention may be practiced with the addition of magnets is an Exelan-HP made by LAM Research Corporation™ of Fremont, Calif. For such a device, the flow rate is preferably between 100 and 300 sccm.

Figure 4:
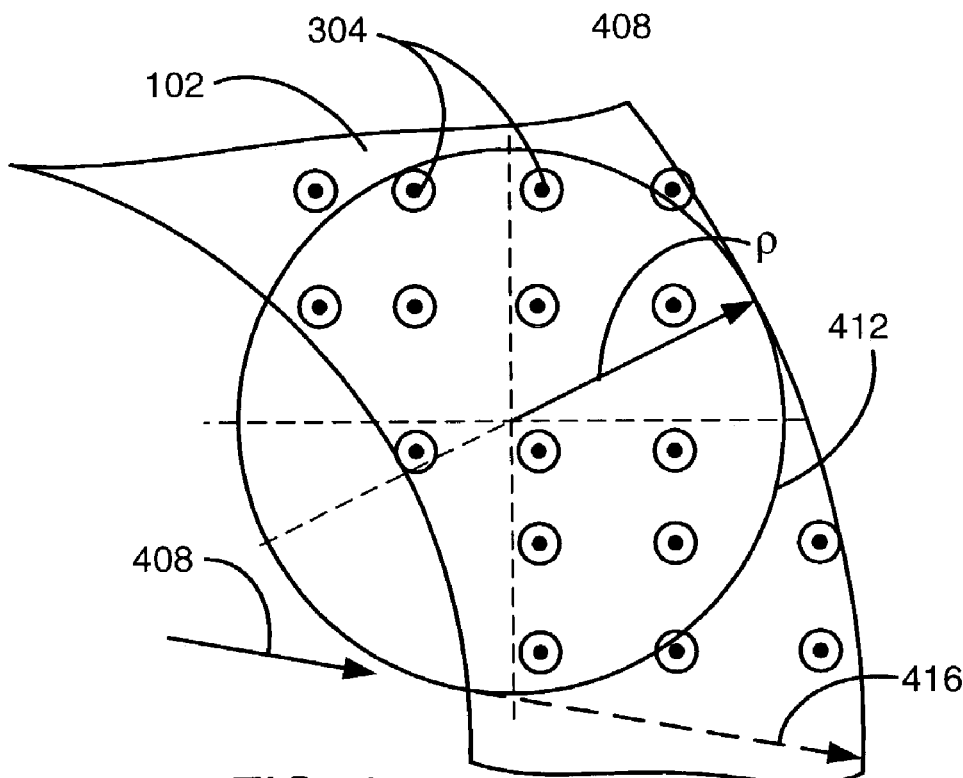
FIG. 4 is a top view of part of the confinement ring.

The basic principal behind the above described Magnetic Trajectory Extension—(MTE) relies on the idea that confinement is largely due to the extinction of plasma between the confinement rings. This idea implies that if the effective length of the confinement rings is extended, with fixed confinement ring gap, confinement will be enhanced. This is due to the ions and electrons having more opportunity to be lost due to collision with the ring's surface. As the plasma propagates between the rings, the loss eventually becomes so great that the plasma is finally extinguished. If this length of travel could be extended, then one would expect that confinement could be enhanced. This concept uses a magnetic field produced by magnets, as described above, to effectively extend the trajectories of both the ions and electrons so that opportunity for plasma loss between the rings is enhanced. These magnets produce a magnetic field, which will result in ions and electrons following a curved trajectory with radius $\rho$ (i.e. the "Larmor" radius $\rho$), as shown in FIG. 4. FIG. 4 is a top view of part of a confinement ring 102. Magnetic filed lines 304 are coming out of the page, as shown. The magnetic field causes a particle with trajectory path 408 to travel a curved trajectory following the path of circle 412. Trajectory 416 is the trajectory that would result if no magnetic field was present. As can be seen, the path of a trajectory along the circle 412 from the magnetic field is greater than the trajectory 416 if no magnetic field was present. This will result in extending the time an ion or electron needs to traverse the confinement rings. In this example, the goal is not to actually magnetically confine a plasma. If the radius ρ is nearly the same as the confinement ring length, then a significant enhancement of the confinement ring transit time (or effective confinement ring length) can be expected.

For illustrative purposes, the confinement rings are assumed to be 0.06 meters wide, which is the difference between an inner radius and outer radius of the confinement rings. The ions are assumed to have a temperature of 450° K. It is assumed that on average the ions enter the confinement ring region with the ion thermal velocity. At a temperature of 450° K the ion thermal velocity is:

$$V_i = \sqrt{\frac{k_B T_i}{M_i}} = 304 \text{ meters/second}$$

The required minimum magnetic field is then given by:

$$B = \frac{M_i V_i}{\rho_i e} = \frac{(40)(1.67 \times 10^{-27})(304)}{(0.06)(1.6 \times 10^{-19})} \approx 21 \text{ Gauss}$$

Where, $\rho_i$ is the radius of the orbit, e is the charge of the ion (single ionization is assumed). For the purposes of this demonstration calculation, Argon is assumed. Argon has a mass of $40 \times 1.67 \times 10^{-27}$ kg.

It should be noted that this same magnetic field would also affect the electrons. To consider electron behavior, it is assumed that the average the electrons will enter the confinement region with the electron thermal velocity. The electrons are assumed to have a temperature of 4 eV (46,400° K). At a temperature of 4 eV the electron thermal velocity is $$V_e = \sqrt{\frac{k_B T_e}{M_e}} = 1.18 \times 10^6 \text{ meters/second}$$

At 30 gauss the radius of curvature $\rho_c$ of the electron trajectories is given by:

$$\rho_e = \frac{M_e V_e}{Be} = 2.3 \times 10^{-3} \text{ meters}$$

This is a much smaller radius than the 0.06 meter ion radius. This is merely a consequence of the fact that the electrons are less massive. Furthermore, they enter the confinement region with higher velocity and thus experience a much larger magnetic force. By inspection of the above results, it is clear that if the ion trajectories are sufficiently bent so as to enhance confinement, the electron trajectories will be even more bent. Thus, for the remainder of this discussion, only the magnetic field required for ion confinement enhancement will be considered.

It should be noted that the magnetic value determined above, for ion confinement enhancement is technologically easy to achieve. For example, it is common to find Samarium Cobalt magnets quoted at fields of 2,000 Gauss. The smallness of the field required for this application implies an additional advantage. When considering any magnetic confinement concept it is usually desired to arrange the magnetic field such that over the wafer the magnetic field is of the same order of magnitude as the earth's magnetic field. The earth's magnetic field is 0.6 Gauss. If one begins with a small field, the difficulty in obtaining this requirement is reduced.

The permanent magnets used are arranged essentially as a magnetic dipole. Such a field will have a dipole like character. Thus, one could expect the B-field to decay as the inverse cube of the distance away from the centerline of the magnets. Using such arguments one can estimate the spatial decay by use of the relations given below.

$$B(d) \propto \frac{20}{d^{1/3}} \Rightarrow d = \left(\frac{21}{0.6}\right)^{1/3} = 3.26 \text{ cm}$$

Although this may be an approximation of the actual magnetic field spatial decay, this analysis reflects the general working of the invention.

An additional concern is the ion-neutral collision rate. The ion-neutral collision rate has the effect of setting an upper limit on the pressure for a system using the concepts outlined here. If a deflected ion suffers many collisions with neutrals before completing a significant portion of its deflected trajectory, then it becomes doubtful that the curved orbits assumed above will actually be followed. The effect desired will be either diminished or lost. This effect may be estimated by assuming that the neutral-neutral collision mean free path best estimates the ion-neutral collision mean free path. The working gas is assumed to be Argon at a pressure of 50 mT. The ion-neutral collision mean free path is estimated as:

$$\lambda_{i-n} = \frac{1}{N_o(P)\sigma_{hardsphere}} = \frac{kT}{(9.73 \times 10^{-16})P} \Rightarrow \lambda_{i-n}(50 \text{ mT}) = 0.62 \text{ cm}$$

A hard-sphere cross section of $\sigma_{hardsphere} = 9.73 \times 10^{-16}$ cm² has been assumed. Assuming confinement rings 6 cm wide, about 10 collisions can be expected during a confinement ring traversal. This is a rather large number and suggests that at pressures above 50 mT, the effect of the magnetic enhancement will be significantly impaired. By increasing the magnetic field such that the Larmor radius is about equal to the collision length this effect is reduced. For the 50 mT case, a Larmor radius of 0.6 cm may be used. To achieve this radius of curvature, a B-field of 210 Gauss would be required.

Figure 5:
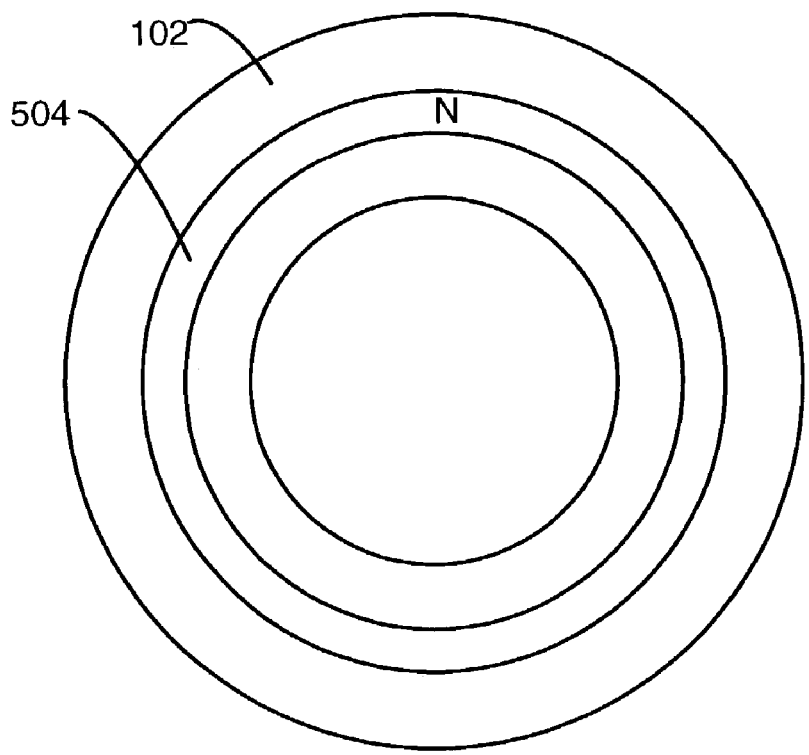
FIG. 5 is a top view of another embodiment of the invention.

FIG. 5 is a top view of another embodiment of the invention. FIG. 5 may use the same process chamber as shown in FIGS. 1-4 except that the plurality of magnets 112, 114, 116, 118, 204 are replaced with an upper ring magnet 504 above the confinement rings 102 and a lower ring magnet is placed below the confinement rings. The upper ring magnet 504 would pass through the regions of the upper magnets in the previous embodiment. The lower ring magnet would pass through the lower magnets in the previous embodiments. Such a configuration would provide a more uniform magnetic field.

Figure 6:
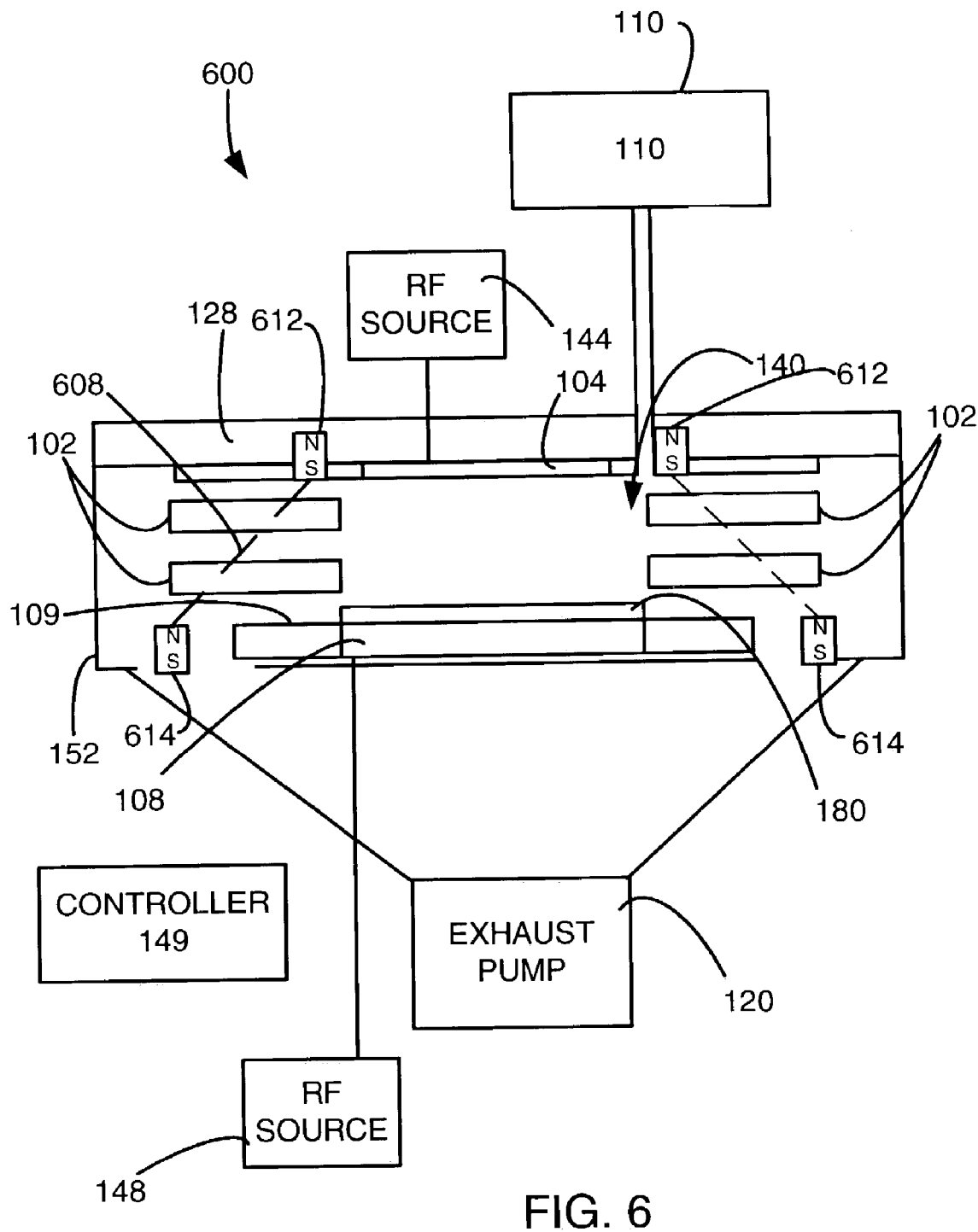
FIG. 6 is a schematic cross-sectional view of another embodiment of the invention.

FIG. 6 is a schematic cross-sectional view of another embodiment of the invention. The process chamber 600 in this embodiment may be the same as the process chamber in FIG. 1, except that canted magnetic fields are provided. Therefore, in this embodiments, the plurality of magnets comprise a ring shaped top magnet 612 and a ring shaped bottom magnet 614, where the diameter of the top magnet 612 is greater than the diameter of the bottom magnet 614. As a result, magnetic field lines 608 are produced between the upper magnet 612 and the lower magnet 614, which is canted (not perpendicular) to the largest surfaces of the confinement rings 102.

Figure 7:
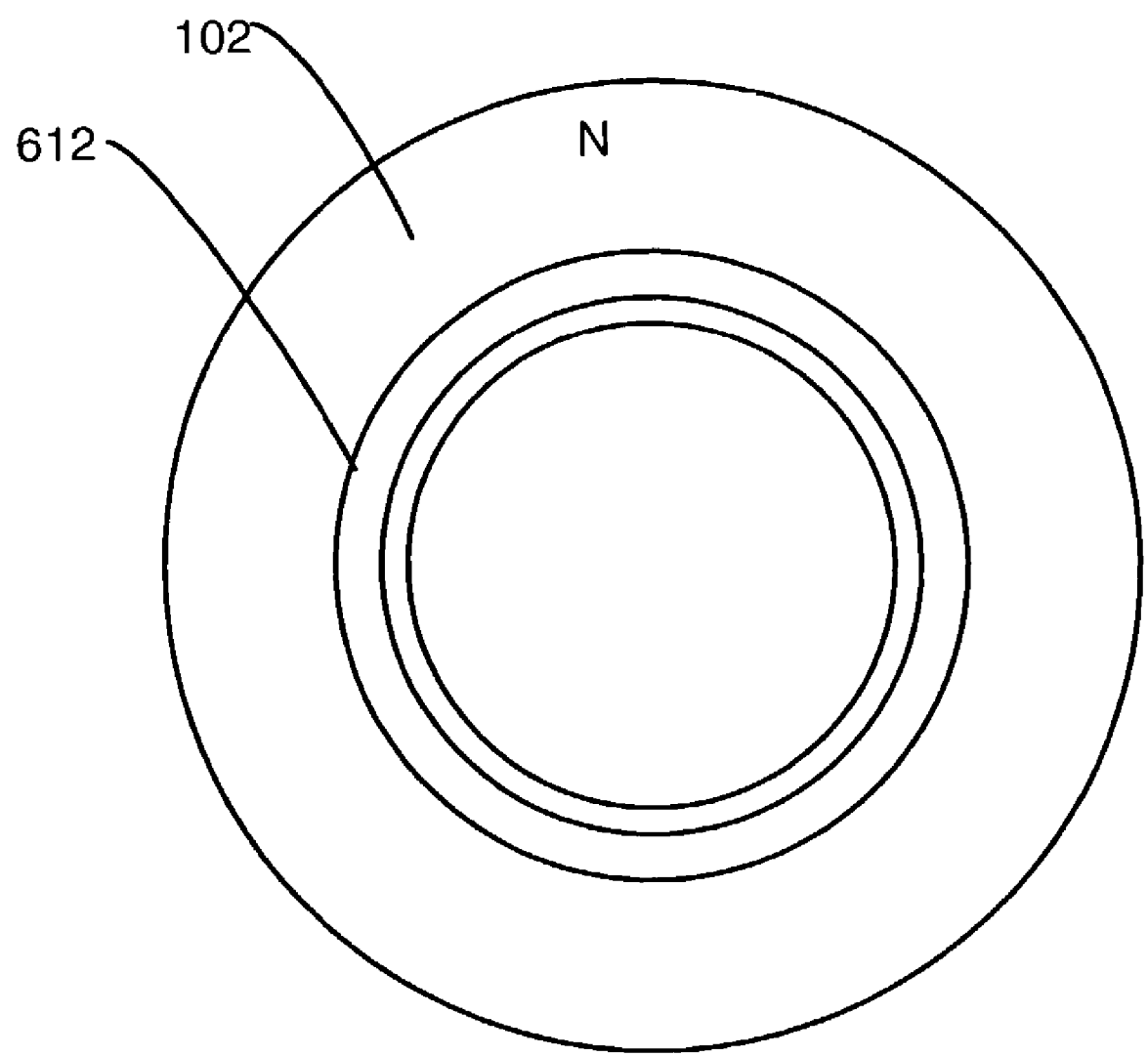
FIG. 7 is a top schematic view of the confinement rings and top magnet ring of the embodiment shown in FIG. 6.

FIG. 7 is a top schematic view of the confinement rings 102 and top magnet ring 612. The top magnet ring 612 is shown as being above part of the circumference of the confinement ring 102. In this embodiment, the top magnet ring 612 is near the inner edge of the confinement rings 102 while the bottom magnet ring 614 is nearer the outer edge of the confinement rings 102. This concept not only relies on increasing the distance traveled between the confinement rings 102, but also enhances the collision rate of charged particles into the rings by magnetically deflecting the charged particles into the confinement rings 102.

For the purposes of a preliminary analysis, it is assumed that the magnets can be positioned such that the B-field forms a 45° angle with the plane formed by the confinement rings. Furthermore, the gap spacing between the confinement rings is assumed to be 1.12 cm (about ½ inch), which is a very aggressive gap spacing and much larger than what has often commercially been typically used.

Computation of the required field begins by first noting that a Larmor radius of about 0.5 cm in a direction normal to the plane of the confinement rings is desired. Again, a temperature of 450° K is assumed. It is also assumed that the ions enter the confinement ring region at an average velocity equal to the ion thermal velocity. At a temperature of 450° K the ion thermal velocity is:

$$V_i = \sqrt{\frac{k_B T_i}{M_i}} = 304 \text{ meters/second}$$

Therefore, the required minimum magnetic field is (converting 0.5 cm to meters):

$$B = \frac{M_i V_i}{(\rho_i e)\cos(45°)} = \frac{(40)(1.67 \times 10^{-27})(304)\sqrt{2}}{(0.005)(1.6 \times 10^{-19})} \approx 360 \text{ Gauss}$$

$\rho_i$ is the radius of the orbit, e is the charge of the ion (single ionization is assumed). For the purposes of this demonstration calculation, the ion is assumed to be Argon, which has a mass of $40*1.67 \times 10^{-27}$ kg.

The assumed Larmor radius is less than the ion-neutral collision length calculated above for a 50 mT neutral pressure. From these values, one can infer that collisions may not significantly affect this approach for pressures up to 50 mT. At 100 mT, the ion-neutral collision length may reduce to values of about 0.3 cm. Thus at 100 mT only one or two collisions can be expected before collision with the confinement rings. It is believed that this collision rate may only marginally affect the magnetic deflection behavior and enhanced confinement may still be observed.

If improved confinement performance at higher pressures is desired, larger magnetic fields may not necessarily help, since one does not want a Larmor radius less than ½ the desired confinement ring spacing.

In the embodiments shown in FIG. 1 and FIG. 6, the magnetic fields pass through the confinement rings 102, in that the magnetic fields intersect the confinement rings. In addition, these embodiments use magnetic fields to increase the percentage of charged ions or electrons that collide with the confinement rings. Various other magnetic configurations may be used to increase the percentage of ions or electrons that collide with the confinement rings. For example, adjacent magnets may have alternating magnetic fields or magnets forming a magnetic pair may have their poles placed in opposite directions. In these embodiments, whether magnet rings or a plurality of magnets is used, it is desirable that the magnets be radially symmetric. In these embodiments, the magnets are placed above and below the confinement rings. This is done by forming the magnets in a ring, either as a solid ring or smaller magnets placed in a ring shape. The diameter of the ring shape formed by the magnets is less than the outer diameter of the confinement rings and greater than the inner diameter of the confinement rings.

Figure 8:
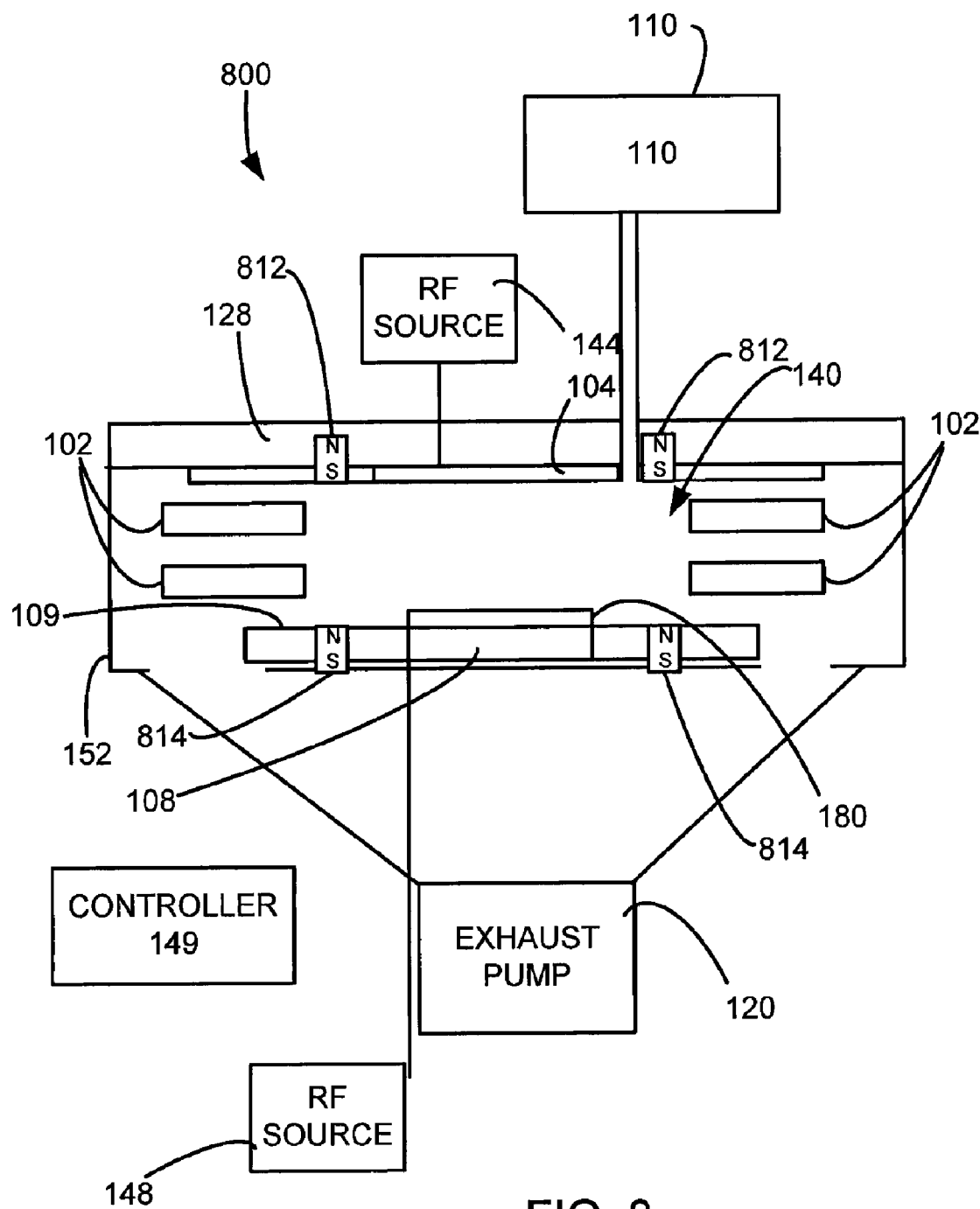
FIG. 8 is a schematic illustration of a process chamber that uses a magnetic field to boost the local plasma density and/or electron temperature near the confinement rings, thus decreasing the density of the plasma at the confinement rings, which enhances physical confinement.

FIG. 8 is a schematic illustration of a process chamber 800 that uses a magnetic field to boost the local plasma density and/or electron temperature near the confinement rings, thus decreasing the density of the plasma at the confinement rings, which enhances physical confinement. In this embodiment, the magnets 812, 814 are moved to positions above and below a region within the confinement rings, as shown in FIG. 8. This concept may have either one of two effects. The local enhancement of density near the magnets may result in a more rapid plasma decay between the magnets and the confinement rings than would otherwise exist, resulting in reduced density in front of the rings. Alternatively, this approach may also enhance plasma potential at the magnet position. This would be due to a preferential confinement of hot electrons, which would boost the local plasma electron temperature. This could result in a local increase of the plasma potential in the "positive" (ion confining) direction. This may then aid in plasma confinement. To accomplish a local enhancement of plasma density and/or electron temperature, the electron trajectories must have a radius of curvature (i.e. the "Larmor Radius") less than the scale size of the region over which one seeks to obtain an enhancement. The expectation then is that such electrons will complete several gyro-orbits before being lost and thus enhance local ionization of the neutral gas.

In an example of this embodiment, it was previously shown that a 21 Gauss field is expected to provide an electron Larmor radius of 0.23 cm. The region, over which plasma enhancement is desired, in this example, is in the range of from 1.5 to 2 cm. Thus, a 21 Gauss magnetic field would be sufficient.

In this embodiment where the magnetic field passes through the aperture formed in the confinement rings and the previous embodiments where the magnetic fields passed through the confinement rings the magnetic fields may be generally defined as passing through the region of the confinement rings.

In this embodiment, whether magnet rings or a plurality of magnets is used, it is desirable that the magnets be radially symmetric. In this embodiments, the magnets are placed above and below the confinement rings. This is done by forming the magnets in a ring, either as a solid ring or smaller magnets placed in a ring shape. The diameter of the ring shape formed by the magnets is less than the inner diameter of the confinement rings. Since the chamber may be placed at various orientations, the placement of the magnets may be more generally described as being on a first side of the confinement rings and second side of the confinement rings opposite from the first side, where placing the magnets above and below the confinement rings is an example of such placement.

Generally, the plasma chamber has a high wafer diameter to electrode gap ratio. A typical wafer size may be 300 mm. Generally, the lower electrode is about the same size as the wafer, so that the lower electrode is about 300 mm. For such a wafer diameter a typical electrode gap would be about 2 cm. Therefore, the wafer or lower electrode diameter to electrode gap ratio in this example would be 300:20 or 15:1. Typical wafer diameter to electrode gap ratios would be from 6:1 to 60:1.

Because the magnetic fields enhance physical confinement but do not provide physical confinement, preferably the magnets do not extend into the gap between the confinement rings or do not cross the gap between the confinement rings. More preferably, the magnets do not extend into the chamber, so that the top magnet does not extend below the chamber ceiling and the bottom magnet does not extend above the chamber floor, as shown in the various embodiments.

Other embodiments of the invention may have other magnetic configurations that provide an additional magnetic confinement to a physical confinement using confinement rings. As mentioned above, the magnets may be positioned to provide an alternating magnetic field. This may create magnetic field lines that are parallel to the surface of the confinement rings, which may direct charge particles into the confinement ring surface.

Other confinement ring configurations may be provided. For example other numbers of confinement rings may be used, such as a single confinement ring or three confinement rings. Preferably, at least one confinement ring is movable to allow changes in process pressures. Some confinement ring configuration may comprise a single movable confinement ring.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A plasma processing apparatus for processing a substrate, comprising:
    a plasma processing chamber with chamber walls;
    a substrate support within the chamber walls;
    a plurality of confinement rings spaced apart from each other, and within and spaced apart from the chamber walls, wherein the confinement rings and the substrate support define a plasma volume; and
    a magnetic source for generating a magnetic field for magnetically enhancing physical confinement provided by the confinement rings, the magnetic field having a strength to bend a trajectory of a particle passing through the magnetic field but not having a strength to magnetically confine a plasma,
    wherein the magnetic source comprises a first magnetic element spaced apart from and placed on a first side of the confinement rings, so that the first magnetic element is closer to the substrate support than the confinement rings, and a second magnetic element spaced apart from and placed on a second side of the confinement rings, so that the second magnetic element is farther from the substrate support than the confinement rings, wherein magnetic field lines passing from the first magnetic element to the second magnetic element pass through the confinement rings.

2. The plasma processing apparatus, as recited in claim 1, wherein the magnetic source is configured such that the magnetic field passing through the confinement rings increases collisions of charged particles with the confinement rings.

3. The plasma processing apparatus, as recited in claim 2, wherein the first magnetic element forms a ring shape with a diameter and the second magnetic element forms a ring shape with a diameter, and wherein the confinement rings have an inner diameter and an outer diameter, wherein the diameters of the first magnetic element and the second magnetic element are less than the outer diameter of the confinement rings and greater than the inner diameter of the confinement rings.

4. The plasma processing apparatus, as recited in claim 3, wherein the diameter of the first magnetic element is not equal to the diameter of the second magnetic element.

5. The plasma processing apparatus, as recited in claim 1, wherein the magnetic fields pass through the region of the confinement rings.

6. The plasma processing apparatus, as recited in claim 5, wherein the first magnetic element forms a ring shape with a diameter and the second magnetic element forms a ring shape with a diameter, and wherein the confinement rings have an inner diameter and an outer diameter, wherein the diameters of the first magnetic element and the second magnetic element are less than the inner diameter of the confinement rings.

7. The plasma processing apparatus, as recited in claim 1, wherein the confinement rings are movable to define a variable gap, wherein the variable gap is used to vary pressure in the plasma volume.

8. The plasma processing apparatus, as recited in claim 7, wherein the first magnetic element and second magnetic element do not cross the variable gap.

9. The plasma processing apparatus, as recited in claim 1, wherein the first magnetic element has a pole from a north pole of the first magnetic element to a south pole of the first magnetic element, wherein the pole of the first magnetic element has a direction that extends between a chamber top to a chamber bottom and wherein the second magnetic element has a pole from a north pole of the second magnetic element to a south pole of the second magnetic element, wherein the pole of the second magnetic element has a direction that extends between the chamber top to the chamber bottom.

10. The plasma processing apparatus, as recited in claim 1, wherein each of the confinement rings has sides that form largest surfaces of the confinement ring wherein the magnetic field lines passing from the first magnetic element to the second magnetic element pass through the sides of the confinement rings that form largest surfaces of the confinement rings at an angle between being perpendicular to 45° with the sides of the confinement rings that form largest surfaces of the confinement rings.

11. The plasma processing apparatus, as recited in claim 1, wherein the confinement rings, comprises a first confinement ring and a second confinement ring spaced from the first confinement ring, wherein the first magnetic element is placed on a first side of the first confinement ring and second confinement ring and is closer to the first confinement ring than to the second confinement ring and the second magnetic element is placed on a second side of the first confinement ring and second confinement ring and is closer to the second confinement ring than to the first confinement ring, and wherein magnetic field lines passing from the first magnetic element to the second magnetic element pass through the first confinement ring and the second confinement ring.

12. The plasma processing apparatus, as recited in claim 11, wherein the first magnetic element has a pole from the north pole of the magnetic element to the south pole of the magnetic element, wherein the pole of the first magnetic element has a direction that extends from the first confinement ring to the second confinement ring.

13. The plasma processing apparatus, as recited in claim 12, wherein each of the confinement rings has sides that form largest surfaces of the confinement ring wherein the magnetic field lines passing from the first magnetic element to the second magnetic element pass through the sides of the confinement rings that form largest surfaces of the confinement rings at an angle between being perpendicular to 45° with the sides of the confinement rings that form largest surfaces of the confinement rings.

14. The plasma processing apparatus, as recited in claim 1, wherein the first magnetic element and the second magnetic element are within the chamber walls.

15. The plasma processing apparatus, as recited in claim 1, wherein the first magnetic element is arranged in a ring shape having a first diameter and the second magnetic element is arranged in a ring shape having a second diameter different from the first diameter, and wherein the magnetic field lines passing from the first magnetic element to the second magnetic element pass through the confinement rings in a canted manner.

16. The plasma processing apparatus, as recited in claim 15, wherein the second diameter is greater than the first diameter.

17. The plasma processing apparatus, as recited in claim 1, wherein the first magnetic element is provided near the inner edge of the confinement rings, and the second magnetic element is provided near the outer edge of the confinement rings.

* * * * *